United States Patent [19]

Okano et al.

[11] Patent Number: 4,800,172
[45] Date of Patent: Jan. 24, 1989

[54] MANUFACTURING METHOD FOR CASCADED JUNCTION FIELD EFFECT TRANSISTOR

[75] Inventors: Jun-ichi Okano, Hyogo; Kiyohito Matsumoto, Himeji, both of Japan

[73] Assignee: Kabushiki Kaisha Toshiba, Kawasaki, Japan

[21] Appl. No.: 152,396

[22] Filed: Feb. 4, 1988

[30] Foreign Application Priority Data

Feb. 9, 1987 [JP] Japan ............................. 62-26366

[51] Int. Cl.⁴ ............... H01L 21/385; H01L 29/80
[52] U.S. Cl. .............................. 437/51; 437/162; 437/911; 357/22
[58] Field of Search ............. 437/51, 162, 911; 357/22

[56] References Cited

U.S. PATENT DOCUMENTS

| | | | |
|---|---|---|---|
| 4,300,151 | 11/1981 | Nishizawa | 357/24 |
| 4,346,513 | 8/1982 | Nishizawa et al. | 357/22 D |
| 4,485,392 | 11/1984 | Singer | 357/22 F |
| 4,516,316 | 5/1985 | Haskell | 437/34 |

FOREIGN PATENT DOCUMENTS

| | | | |
|---|---|---|---|
| 2833068 | 2/1979 | Fed. Rep. of Germany | 357/22 E |
| 0148385 | 11/1979 | Japan | 357/22 R |
| 0166075 | 10/1982 | Japan | 437/911 |
| 0135759 | 8/1984 | Japan | 357/22 R |
| 0147577 | 7/1986 | Japan | 357/22 MD |

OTHER PUBLICATIONS

Patent Abstracts of Japan, vol. 5, No. 125 (E-69) [797], Aug. 12, 1981; JP-A-56 62372 (Hitachi Seisakusho) May 28, 1981.
Patent Abstracts of Japan, vol. 7, No. 264 (E-212) [1409], 11/24/83; JP-A-58 147 176 (Daini Seikosha) Sep. 1, 1983.
Patent Abstracts of Japan, vol. 9, No. 251 (E-348) [1975], 1985; & JP-A-60 101 972 (Matsushita Denki Sangyo) Jun. 6, 1985.
Patent Abstracts of Japan, vol. 4, No. 152 (E-31) [634], 10/24/80; & JP-A-55 102 253 (Nippon Denki) Aug. 5, 1980.
Patent Abstracts of Japan, vol. 3, No. 98 (E-131), Aug. 18, 1979; & JP-A-54 75280 (Nippon Denki) Jun. 15, 1979.

*Primary Examiner*—Olik Chaudhuri
*Attorney, Agent, or Firm*—Finnegan, Henderson, Farabow, Garrett, & Dunner

[57] ABSTRACT

A method for manufacturing cascaded junction type field effect transistors comprises the steps of forming an epitaxial layer of a first conductivity type used as a channel region on a semiconductor substrate of a second conductivity type and performing selective oxidation to form a thick oxide film on part of the epitaxial layer. Then, the thick oxide film is removed to provide a part of the surface which is a level lower than the main surface of the epitaxial layer. Next, an impurity of the first conductivity type is doped into the low and high surface areas of the epitaxial layer from the surface thereof to form source and drain regions separated at a preset distance. After this, an impurity of the second conductivity type is doped into the low and high level surface areas of the epitaxial layer between the source and drain regions to simultaneously form first and second junction gates which are separated at a present distance. Then, the semiconductor substrate is connected to the second junction gate and source region to connect two junction FETs in cascade fashion.

18 Claims, 7 Drawing Sheets

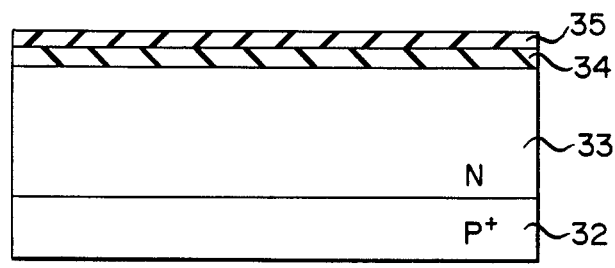
F I G. 7A
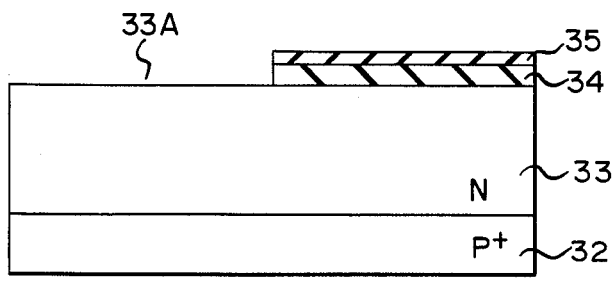
F I G. 7B
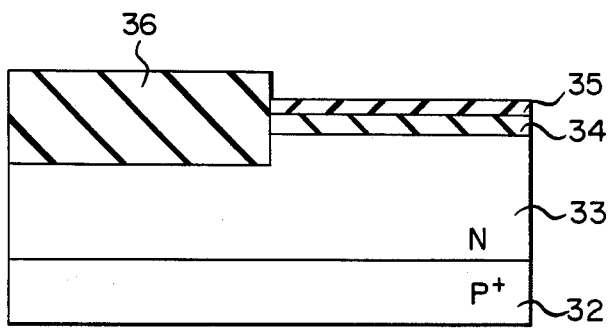
F I G. 7C
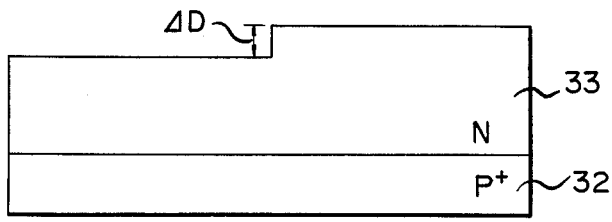
F I G. 7D

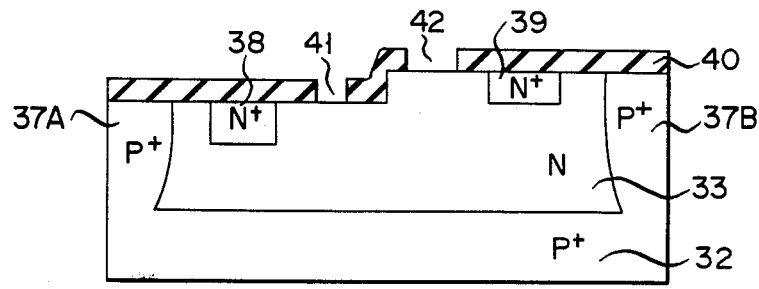
F I G. 7E
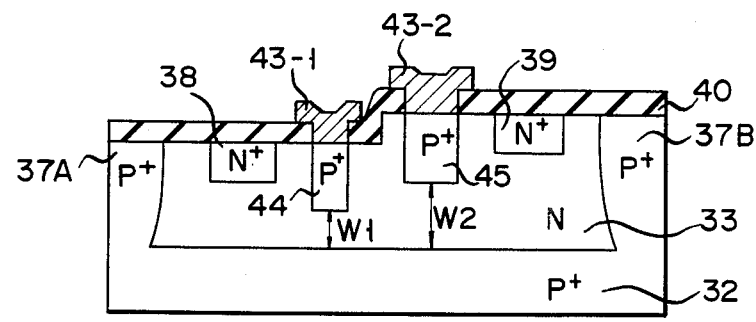
F I G. 7F
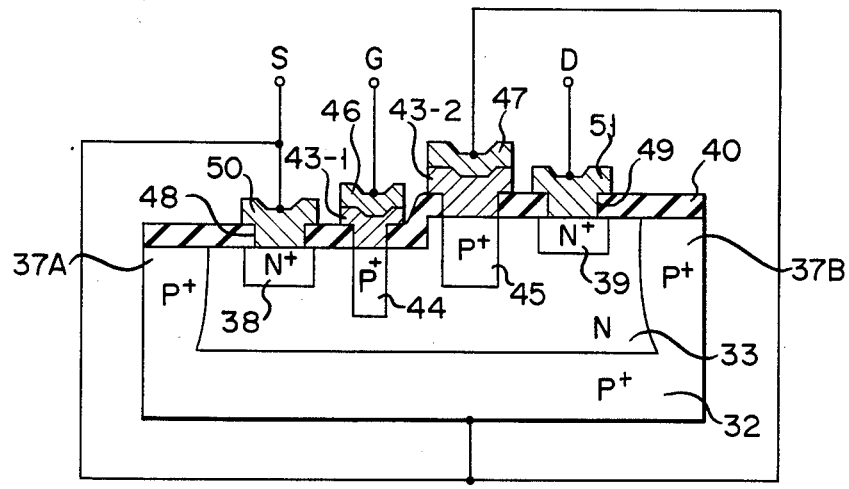
F I G. 7G

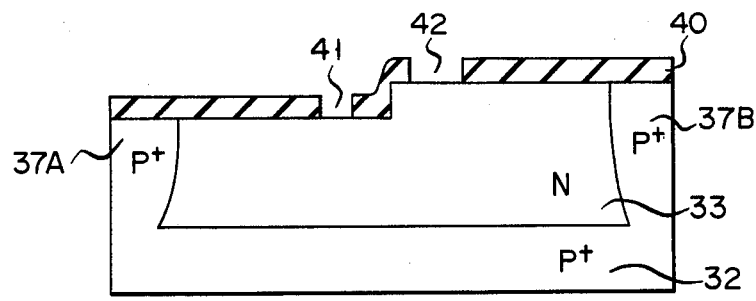
F I G. 9A
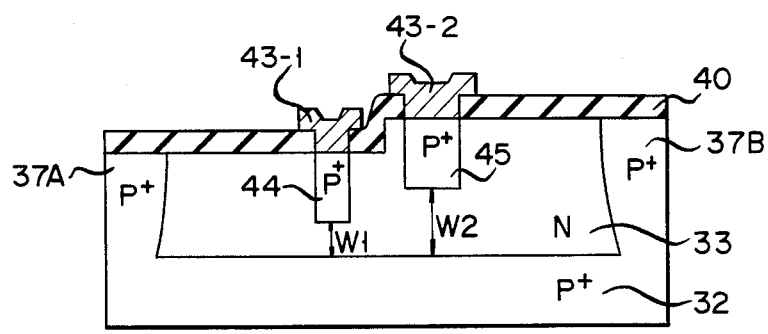
F I G. 9B
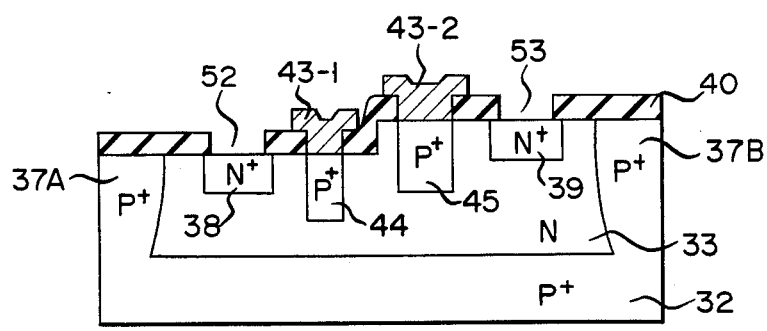
F I G. 9C

MANUFACTURING METHOD FOR CASCADED JUNCTION FIELD EFFECT TRANSISTOR

BACKGROUND OF THE INVENTION

This invention relates to a manufacturing method for cascaded junction type field effect transistors (which are hereinafter referred to as cascade FETs), and more particularly to a method for manufacturing two junction gates of a cascade FET.

In general, a cascade FET is formed as shown in FIG. 1. N-type channel region 12 is formed on P+-type semiconductor substrate 11. N+-type source region 13 and drain region 14 are formed with a predetermined distance from each other in the surface of channel region 12. Further, first and second P+-type junction gates 15 and 16 are formed with a predetermined distance from each other in that surface area of channel region 12 which lies between source and drain regions 13 and 14. Insulation film 17 is formed on channel region 12. Contact holes 18 and 19 are formed in those portions of insulation film 17 which are positioned on source and drain regions 13 and 14. Source and drain regions 13 and 14 are respectively connected to source and drain electrodes 20 and 21 via contact holes 18 and 19. Contact holes 22 and 23 are formed in those portions of insulation film 17 which are positioned on junction gates 15 and 16. Junction gates 15 and 16 are respectively connected to gate electrodes 24 and 25 via contact holes 22 and 23. Source electrode 20 and gate electrode 25 connected to second junction gate 16 which is formed near drain region 14 are connected to semiconductor substrate 11.

FIG. 2 shows an equivalent circuit of the cascade FET of FIG. 1. First junction FET 26 is formed of substrate 11, channel region 12, source region 13, drain region 14 and first junction gate 15. Second junction FET 27 is formed of substrate 11, channel region 12, source region 13, drain region 14 and second junction gate 16. Thus, the cascade FET has first common source junction FET 26 and second gate common junction FET 27 which are cascade connected. Since two junction FETs 26 and 27 are thus cascade connected, a feedback capacitance component from the drain of junction FET 26 is substantially grounded with respect to A.C. signals and the FET has a small feedback capacitance Crss. That is, as is well known in the art, feedback capacitance Crss of the junction FET is represented by the sum of "Cj+Cm" in which Cj is a junction capacitance between the gate and drain and Cm is a MOS capacitance associated with the aluminum wiring section between the gate and drain. MOS capacitance Cm is extremely small in comparison with junction capacitance. In the cascade FET, junction capacitor Cj between the gate and drain of first junction FET 26 is grounded via second junction gate 16, and therefore junction capacitance Cj will be "0" in the high frequency operation mode. In this case, "Crss=Cm" is attained, and the cascade FET will have feedback capacitance Crss than that of a single FET.

Further, in the cascade FET described above, a voltage between the drain and source of first junction FET 26 becomes equal to that between the gate and source of second junction FET 27, and thus first junction FET 26 applies a negative bias to second junction FET 27. Thus, the general characteristic of the cascade FET depends on the combination of characteristics of junction FETs 26 and 27.

It is well known that, in the cascade FET, forward admittance |Yfs| and feedback capacitance Crss will change according to the ratio of pinch-off voltages $V_{G1S(OFF)}$ and $V_{G2S(OFF)}$ between the gate and source of junction FETs 26 and 27. Pinch-off voltages $V_{G1S(OFF)}$ and $V_{G2S(OFF)}$ between the gate and source are respectively determined by channel widths W1 and W2 and the impurity concentration of those portions of channel region 12 which lies under junction gates 15 and 16 of first and second FETs 26 and 27.

FIG. 3 shows the static characteristic of first FET 26 and the transfer characteristic of second FET 27. In the case where pinch-off voltage $V_{G2S(OFF)}$ between the gate and source of FET 27 is substantially equal to pinch-off voltage $V_{G1S(OFF)}$ between the gate and source of FET 26 as shown by solid line 28, forward transfer admittance |Yfs| is lowered in an operation region in which saturation drain current $I_{DSS}$ flows as shown by broken line 29 in FIG. 4. Therefore, in order to attain the normal characteristic forward transfer admittance |Yfs| (that is, forward transfer admittance |Yfs| is not lowered in an operation region in which saturation drain current $I_{DSS}$ flows) as shown by solid line 30 in FIG. 4, it becomes necessary to set pinch-off voltage $V_{G2S(OFF)}$ between the gate and source of FET 27 larger than twice pinch-off voltage $V_{G1S(OFF)}$ between the gate and source of FET 26 as shown by solid line 31 in FIG. 3.

It is also known that feedback capacitance Crss of the FET has a large value in the nonsaturation region, it is necessary to set voltage $V_{DS}$ between the source and drain so as to satisfy the condition that "$V_{DS} > [V_{G1S(OFF)} + V_{G2S(OFF)}]$". Recently, a low drain voltage is often used, and therefore it is necessary to attain the characteristic of feedback capacitance Crss with respect to voltage $V_{DS}$ between the source and drain as shown in FIG. 5. In general, in order to attain drain-source voltage $V_{DS}$ of 5 V and low feedback capacitance Crss, it is necessary to satisfy the condition that $V_{G2S(OFF)} = 5 V_{G1S(OFF)}$, and $V_{G2S(OFF)} < V_{G1S(OFF)}$.

Pinch-off voltages $V_{G1S(OFF)}$ and $V_{G2S(OFF)}$ between the gate and source of junction FETs 26 and 27 are determined by the impurity concentrations of junction gates 15, 16 and channel region 12 and widths W1 and W2. For forming junction gates 15 and 16, an impurity is first selectively diffused into an element formation region for junction gate 15 to form a P+-type region. Then, an impurity is diffused into element formation regions for first and second junction gates 15 and 16 while the reverse withstanding voltage of the P+-type region is being measured and the diffusion depth thereof is controlled, and thus junction gates 15 and 16 are formed. However, if junction gates 15 and 16 are formed in two diffusion steps, the ratio $V_{G1S(OFF)}/V_{G2S(OFF)}$ of pinch-off voltages between the gate and source may vary in the same production lot and between different production lots.

FIG. 6 shows variations in the ratio $V_{G2S(OFF)}/V_{G1S(OFF)}$ of pinch-off voltages between the gate and source in the same lot and between different lots in the case where junction gates 15 and 16 are formed by performing two diffusion steps. As shown in FIG. 6, variation is caused in the ratio of the same lot and greater variation is caused in the ratios between different lots.

Therefore, feedback capacitance Crss and forward transfer admittance |Yfs| are affected to easily vary, lowering the manufacturing yield. Variation in the ratio $V_{G2S(OFF)}/V_{G1S(OFF)}$ of pinch-off voltages between the gate and source is directly caused by variation in the ratio W2/W1 of the channel widths and impurity concentration of the diffusion layers of junction gates 15 and 16. Further, it is affected by the impurity concentration and diffusion depth of the diffusion layer formed in the first diffusion step for forming junction gate 15. In the diffusion step effected to control saturation drain current $I_{DSS}$, since diffusion speed of junction gate 15 is different from that of junction gate 16, it becomes difficult to precisely set the channel width ratio W2/W1.

SUMMARY OF THE INVENTION

An object of this invention is to provide a method for manufacturing cascaded junction type field effect transistors which can be formed to attain a desired feedback capacitance and forward admittance at the same time without varying the ratio of pinch-off voltages between the gate and source of two junction type field effect transistors.

According to one embodiment of this invention, there is provided a method for manufacturing cascaded junction type field effect transistors which comprises steps of forming a channel region of a first conductivity type on a substrate of a second conductivity type; making a difference in level on the surface of the channel region; forming source and drain regions in the low and high level surface areas of the channel region, respectively; forming an insulation film having first and second gate diffusion holes formed in positions corresponding to the low and high level surface areas of the channel region; forming first and second junction gates in the low and high level surface areas of the channel region by simultaneously doping an impurity of the second conductivity type into the channel region through the holes of the insulation film using the same diffusion source; and connecting the substrate to the second gate which is near the drain region and to the source region.

According to the manufacturing method, the channel region formed of an epitaxial layer of the first conductivity type is formed on the semiconductor substrate of the second conductivity type to have two different surface levels and the first and second junction gates with different diffusion depths are simultaneously formed by doping an impurity into the high and low surface areas. Therefore, the channel widths under the first and second junction gates can be freely adjusted by properly controlling the difference in level of the channel region. The difference in level can be made by forming an oxide film in a specified area and removing the oxide film. Since the thickness of the oxide film can be precisely controlled, the difference in level can be set to a designed value at a high precision, making it possible to attain a precise ratio of the channel widths. Further, since two junction gates with different diffusion depths are formed by a single diffusion process, the manufacturing process can be simplified. Since two junction gates are formed in the channel region of the same impurity concentration, there occurs no problem which is caused by the re-diffusion speed of impurity in the junction gate formed by the first diffusion step in the case where two junction gates are formed by performing two diffusion steps. Therefore, variation in the ratio of the pinch-off voltages of the gate and source of two junction FETs in the cascade FET can be suppressed to a minimum, and both characteristics of the desired feedback capacitance and forward admittance can be attained.

BRIEF DESCRIPTION OF THE DRAWINGS

FIGS. 7A to 7G are cross-sectional views for illustrating the manufacturing method for forming a cascade FET according to one embodiment of this invention;

FIGS. 9A to 9C are cross-sectional views for illustrating the manufacturing method for forming a cascade FET according to another embodiment of this invention.

DETAILED DESCRIPTION OF THE PREFERRED EMBODIMENTS

Figure 1:
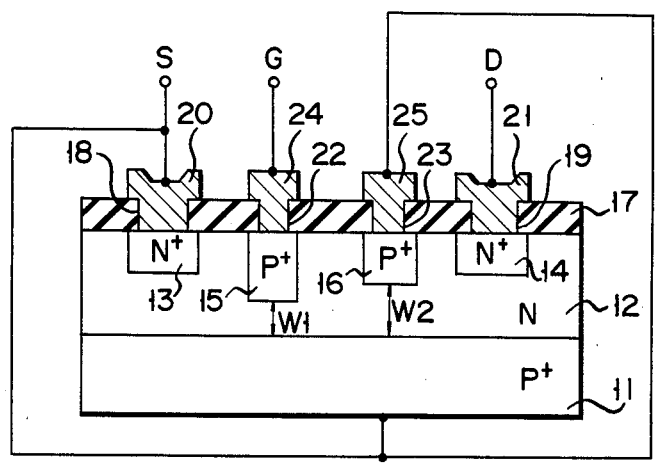
FIG. 1 is a cross sectional view of the prior art cascade FET.
Figure 2:
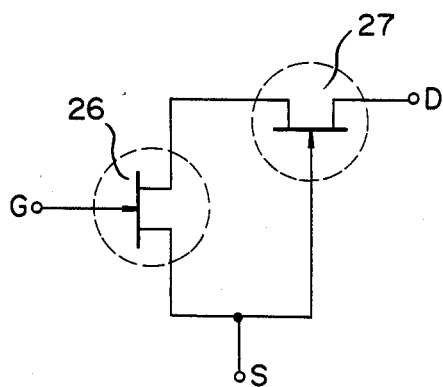
FIG. 2 is an equivalent circuit diagram of the cascade FET shown in FIG. 1.
Figure 3:
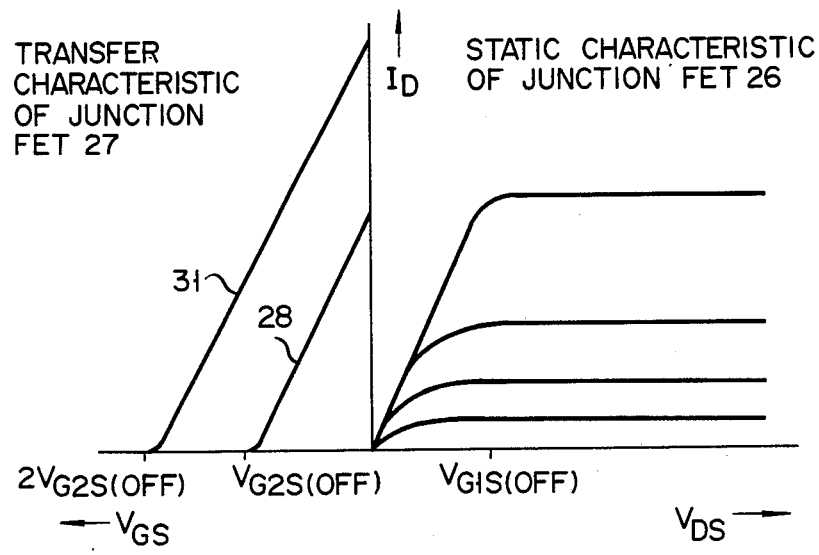
FIG. 3 is a characteristic diagram showing the static and transfer characteristics of junction FETs constituting the cascade FET of FIG. 1.
Figure 4:
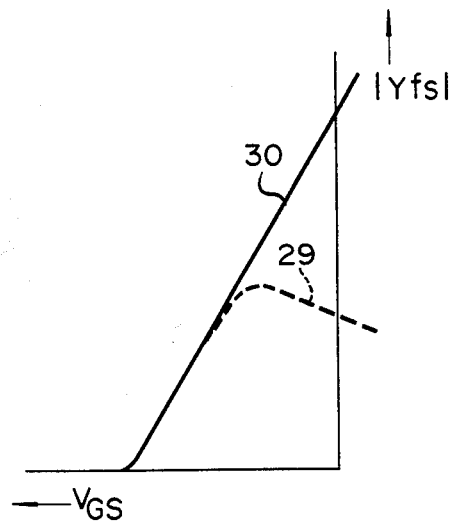
FIG. 4 is a characteristic diagram showing the relation between the forward transfer admittance and the drain-source voltage of the cascade FET shown in FIG. 1.
Figure 5:
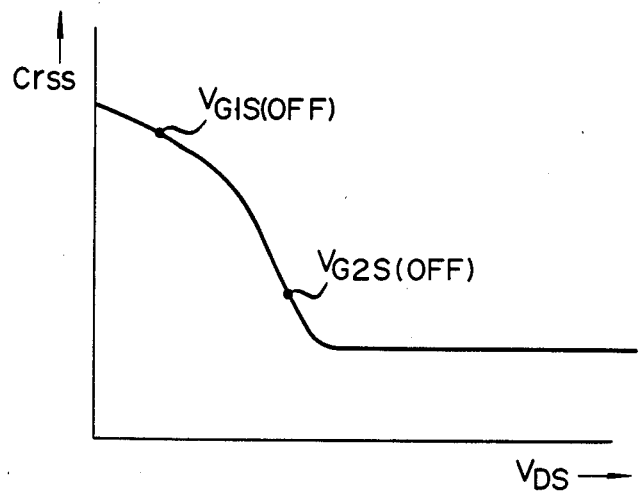
FIG. 5 is a characteristic diagram showing the relation between the feedback capacitance and the drain-source voltage of the cascade FET shown in FIG. 1.

FIGS. 7A to 7G illustrate a sequence of the manufacturing steps for forming a cascade junction type field effect transistor (cascade FET) according to one embodiment of this invention. As shown in FIG. 7A, N-type epitaxial layer 33 having a thickness of 2.5 μm, for example, which will be used to form a channel region is formed on P+-type semiconductor substrate 32. Silicon oxide film 34 with a thickness of 3500 Å is formed on epitaxial layer 33. Then, a oxidation resistant film such as silicon nitride film 35 is formed on silicon oxide film 34 having a thickness of 1500 Å.

Next, as shown in FIG. 7B, silicon nitride film 35 and silicon oxide film 34 are selectively etched by using a PEP method to expose the surface of portion 33A of epitaxial layer 33 on which a silicon oxide film is to be formed.

Then, the semiconductor substrate (epitaxial layer 33) of FIG. 7B is oxidized by placing it in the oxidation atmosphere or applying steam to it. Thus, exposed portion 33A of epitaxial layer 33 is oxidized to form silicon oxide film 36. At this time, that portion which is covered with silicon nitride film 35 is not oxidized so that a semiconductor structure as shown in FIG. 7C can be obtained. The thickness of silicon oxide film 36 is 8000 Å, for example. Silicon oxide film 36 is so formed that the upper portion thereof which locates above the surface of epitaxial layer 33 occupies 60% and the lower portion thereof which locates under the surface of epitaxial layer 33 or in epitaxial layer 33 occupies 40%.

Next, as shown in FIG. 7D, silicon nitride film 35 and silicon oxide films 36 and 34 are removed by using, for example, fluoric acid. Thus, part of the surface portion of epitaxial layer 33 is removed and epitaxial layer 33 has the difference of ΔD (3200 Å) in surface level.

Then, as shown in FIG. 7E, an impurity for forming a P+-type region is selectively doped into epitaxial layer 33 by an ion implantation technique to form isolation regions 37A and 37B. Further, an impurity for forming an N+-type region is selectively doped into the surface area of epitaxial layer 33 by an ion implantation technique to form source region 38 and drain region 39. After this, silicon oxide film 40 with a thickness of 5000 to 6000 Å is formed on epitaxial layer 33. First and second gate diffusion holes 41 and 42 which are used to form first and second junction gates are respectively formed in the lower and upper level portions of silicon oxide film 40.

Subsequently, boron doped polysilicon film (BPS film) 43 is formed on silicon oxide film 40. BPS film 43 is used as a P-type impurity diffusion source to form a P-type region which creates a junction gate in epitaxial layer 33. An impurity is doped into epitaxial layer 33 with BPS film 43 as a diffusion source to form P+-type junction gates 44 and 45. At this time, the diffusion process is effected while the reverse withstanding voltage of junction gate 44 is being measured to control saturation drain current $I_{DSS}$. Junction gate 44 is formed to have channel width W1 (for example, 3000 Å) and junction gate 45 is formed to have channel width W2 (for example, 6200 Å). Channel widths W1 and W2 are set such that the relation of "W1−W2=ΔD" can be attained. Thereafter, BPS film 43 is patterned to leave BPS films 43-1 and 43-2 which are formed on junction gates 44 and 45.

Next, gate wirings 46 and 47 of aluminum, for example, are respectively formed on BPS films 43-1 and 43-2 as shown in FIG. 7G. BPS films 43-1 and 43-2 serve as the surface stabilization films for junction gates 44 and 45, enhancing the reliability of the device. Further, contact holes 48 and 49 are formed in oxide film 40 in positions corresponding to source and drain regions 38 and 39, and source and drain electrodes 50 and 51 of, for example, aluminum are formed on source and drain regions 38 and 39. Thus, source and drain regions 38 and 39 are electrically connected to source and drain electrodes 50 and 51, respectively. After this, source electrode 50 and gate electrode 47 which is near drain region 39 are connected to semiconductor substrate 32.

With the manufacturing method as described above, epitaxial layer 33 as the channel region is formed to have a variation in its surface level, and first and second junction gates 44 and 45 are respectively formed in the low and high level surfaces of epitaxial layer 33 by performing one diffusion step. Therefore, channel width W1 under first junction gate 44 and channel width W2 under second junction gate 45 can be freely set according to difference ΔD in the surface level. The thickness of silicon oxide film 36 obtained in the step of FIG. 7C can be controlled with high precision and the reproducibility thereof is high. Therefore, variation in the ratio of pinch-off voltages between the gate an source of two cascade-connected junction FETs can be reduced, and the variation is reduced in the same lot and between different lots. Further, since two junction gates with different junction depths can be formed in one diffusion step, the manufacturing process can be simplified. In this embodiment, two junction gates are formed in epitaxial layer 33 of the same impurity concentration. Thus, this embodiment is free of the problem caused by the re-diffusion speed of impurity of the junction gate which is formed in the first diffusion step of the prior art manufacturing method in which two diffusion steps are effected to form two junction gates. This makes it possible to reduce variation in the ratio of pinch-off voltages between the gate and source of two junction FETs of the cascade FET, and satisfactory characteristics of the feedback capacitance and forward transfer admittance can be simultaneously attained.

Figure 6:
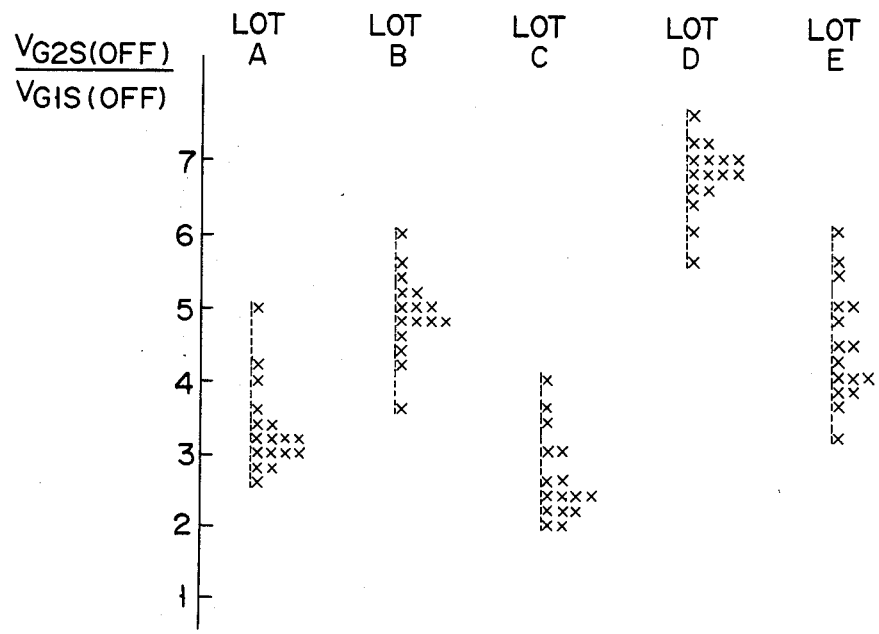
FIG. 6 is a characteristic distribution diagram showing variation in the ratio of the pinch-off voltages between the gate and source of the cascade FETs of the same lot and of the different lots formed by the prior art manufacturing method.
Figure 8:
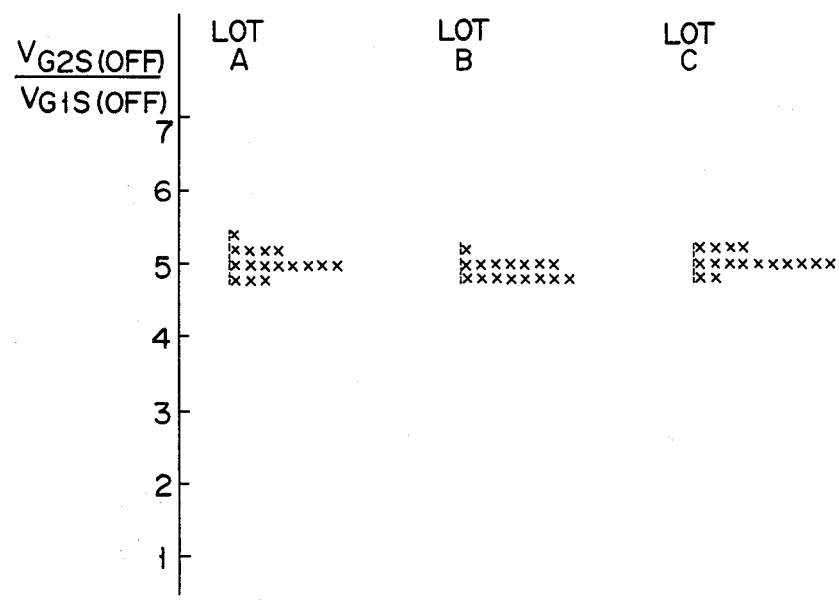
FIG. 8 is a characteristic distribution diagram showing variation in the ratio of the pinch-off voltages between the gate and source of the cascade FETs of the same lot and of the different lots formed by the manufacturing method of this invention.

FIG. 8 is a characteristic distribution diagram showing variation in the ratio of pinch-off voltages between the gate and source in the same lots and in different lots of cascade FETs manufacturing by the manufacturing method for cascade FETs according to this invention. As is clearly seen by comparing the characteristic distribution diagram of FIG. 8 and that of FIG. 6, the variation in the same lot and between different lots is extremely smaller in this invention than in the prior art.

In the embodiment described above, source and drain regions 38 and 39 are formed in the step of FIG. 7E prior to formation of first and second junction gates 44 and 45. However, source and drain regions 38 and 39 can be formed after formation of junction gates 44 and 45 as shown in FIGS. 9A to 9C. In this case, after epitaxial layer 33 is formed to have difference ΔD in the surface level in the same manner as shown in FIGS. 7A to 7D, an impurity for forming a P+-type region is selectively doped into epitaxial layer 33 by an ion implantation technique as shown in FIG. 9A (corresponding to FIG. 7E) and thus isolation regions 37A and 37B are formed. Then, silicon oxide film 40 with a thickness of 5000 to 6000 Å is formed on epitaxial layer 33, and first and second gate diffusion holes 41 and 42 for forming first and second junction gates are formed in the low and high level surface areas of silicon oxide film 40.

After this, boron doped polysilicon film (BPS film) 43 is formed on silicon oxide film 40 as shown in FIG. 9B. BPS film 43 is used as a diffusion source of P-type impurity for forming junction gates in epitaxial layer 33. That is, BPS film 43 is used to diffuse an impurity into epitaxial layer 33 so as to simultaneously form junction gates 44 and 45. At this time, the process of doping an impurity into epitaxial layer 33 is effected while the reverse withstanding voltage is being measured to control saturation drain current $I_{DSS}$. Junction gate 44 is formed to have channel width W1 (for example, 3000 Å) and junction gate 45 is formed to have channel width W2 (for example, 6200 Å). Thereafter, BPS film 43 is patterned to leave BPS films 43-1 and 43-2 which are formed on junction gates 44 and 45.

Next, source and drain diffusion holes 52 and 53 are formed in those portions of oxide film 40 which correspond in position to source and drain formation areas, as shown in FIG. 9C. BPS films 43-1 and 43-2 are masked, permitting an impurity to be doped into the surface area of epitaxial layer 33 through holes 52 and 53. Thus, source and drain regions 38 and 39 are formed. After this, gate wirings of aluminum, for example, are respectively formed on BPS films 43-1 and 43-2 in the same manner as in the step of FIG. 7G. Then, source and drain electrodes of, for example, aluminum are formed on source and drain regions 38 and 39. Thus, source and drain regions 38 and 39 are electrically connected to the source and drain electrodes, respectively. After this, the source electrode and the gate electrode which is near drain region 39 are connected to semiconductor substrate 32.

With the manufacturing method as described above, variation in the ratio of pinch-off voltages between the gate and source of two cascade-connected junction FETs can be reduced in the same manner as in the former embodiment, and satisfactory characteristics of the feedback capacitance and forward transfer admittance can be simultaneously attained.

Further, in each embodiment, the variation in surface level is made on the channel region (epitaxial layer 33) by performing selective oxidation using the oxidation resistance film to form the silicon oxide film and removing the silicon oxide film. However, the variation in the surface level may be created by using other methods.

What is claimed is:

1. A method for manufacturing cascaded junction type field effect transistors which comprises the steps of:
    forming a channel region of a first conductivity type on a substrate of a second conductivity type;
    creating variations in the surface level on the surface of said channel region;
    forming source and drain regions of the first conductivity type in the low and high level surface areas of said channel region, respectively;
    forming an insulation film having first and second gate diffusion holes formed in a position corresponding to the low and high level surfaces of said channel region;
    forming first and second junction gates in the low and high level surface areas of said channel region by simultaneously doping an impurity of the second conductivity type into said channel region through said holes of said insulation film using the same diffusion source; and
    connecting said substrate to said second junction gate which is near said drain region, and to said source region.

2. A method for manufacturing junction type field effect transistors according to claim 1, wherein said substrate is a semiconductor substrate of the second conductivity type and said channel region is formed of an epitaxial layer of the first conductivity type formed on said semiconductor substrate.

3. A method for manufacturing junction type field effect transistors according to claim 1, wherein said substrate is a semiconductor substrate of the second conductivity type and said channel region is formed of an epitaxial layer of the first conductivity type formed on said semiconductor substrate; said step of creating variations in the surface level of said channel region includes the steps of forming a pattern of oxidation resistant film on said epitaxial layer, forming an oxide film which lies partly in said epitaxial layer and partly on the main exposed surface of said epitaxial layer, and removing said oxide film and oxidation resistant film to form a surface which is at a lower level than the main surface of said epitaxial layer.

4. A method for manufacturing junction type field effect transistors according to claim 3, further comprising a step of forming an isolation region of the second conductivity type in said epitaxial layer after said step of forming said epitaxial layer is effected.

5. A method for manufacturing junction type field effect transistors according to claim 3, wherein said oxidation resistant film is formed of a silicon nitride film.

6. A method for manufacturing junction type field effect transistors according to claim 3, further comprising a step of forming a buffer oxide film between said oxidation resistant film and said epitaxial layer.

7. A method for manufacturing junction type field effect transistors according to claim 1, wherein said step of forming first and second junction gates is effected by using a boron doped polysilicon film as a diffusion source.

8. A method for manufacturing junction type field effect transistors according to claim 7, wherein said boron doped polysilicon film is left behind on said first and second junction gates.

9. A method for manufacturing junction type field effect transistors according to claim 1, wherein said step of forming source and drain regions is effected after said step of forming said first and second junction gates.

10. A method for manufacturing junction type field effect transistors according to claim 1, wherein the characteristics of two field effect transistors are controlled according to variations in the surface level of said epitaxial layer.

11. A method for manufacturing cascaded junction type field effect transistors comprising the steps of:
    forming an epitaxial layer of a first conductivity type on the main surface of a semiconductor substrate of a second conductivity type;
    forming a pattern of oxidation resistant film on said epitaxial layer;
    performing selective oxidation with said pattern of oxidation resistant film as a mask to form an oxide film on the exposed surface of said epitaxial layer and in said epitaxial layer;
    removing said oxide film and oxidation resistant film to lower the surface level of part of said epitaxial layer to a level less than the main surface of said epitaxial layer, thus creating variations in the surface level on said epitaxial layer;
    forming source and drain regions of the first conductivity type with a high impurity concentration in the low and high level surface areas of said epitaxial layer;
    forming an insulation film having first and second diffusion holes on said epitaxial layer of which variations in the surface level have been formed;
    forming first and second junction gates in the low and high level surface areas of said epitaxial layer by simultaneously doping an impurity of the second conductivity type into said epitaxial layer through said holes of said insulation film using the same diffusion source; and
    connecting said substrate to said second junction gate which is near said drain region, and to said source region.

12. A method for manufacturing junction type field effect transistors according to claim 11, further comprising a step of forming an isolation region of the second conductivity type in said epitaxial layer after said step of forming said epitaxial layer is effected.

13. A method for manufacturing junction type field effect transistors according to claim 11, wherein said oxidation resistant film is formed of a silicon nitride film.

14. A method for manufacturing junction type field effect transistors according to claim 11, further comprising a step of forming a buffer oxide film between said oxidation resistant film and epitaxial layer.

15. A method for manufacturing junction type field effect transistors according to claim 11, wherein said step of forming first and second junction gates is effected by using a boron doped polysilicon film as a diffusion source.

16. A method for manufacturing junction type field effect transistors according to claim 15, wherein said boron doped polysilicon film is left behind on said first and second junction gates.

17. A method for manufacturing junction type field effect transistors according to claim 11, wherein said step of forming source and drain regions is effected after said step of forming said first and second junction gates.

18. A method for manufacturing junction type field effect transistors according to claim 11, wherein the characteristics of two field effect transistors are controlled according to variations in the surface level of said epitaxial layer.

* * * * *